United States Patent
Nakamura

(10) Patent No.: US 7,491,971 B2
(45) Date of Patent: Feb. 17, 2009

(54) TRANSISTOR ARRAY PANEL, LIQUID CRYSTAL DISPLAY PANEL, AND METHOD OF MANUFACTURING LIQUID CRYSTAL DISPLAY PANEL

(75) Inventor: Yayoi Nakamura, Hino (JP)

(73) Assignee: Casio Computer Co., Ltd., Tokyo (JP)

( * ) Notice: Subject to any disclaimer, the term of this patent is extended or adjusted under 35 U.S.C. 154(b) by 28 days.

(21) Appl. No.: 11/492,114

(22) Filed: Jul. 24, 2006

(65) Prior Publication Data
US 2007/0023752 A1 Feb. 1, 2007

(30) Foreign Application Priority Data
Jul. 26, 2005 (JP) ............................. 2005-215717

(51) Int. Cl.
*H01L 29/04* (2006.01)
(52) U.S. Cl. ..................... 257/59; 257/72; 257/40; 257/E27.1; 257/E29.117
(58) Field of Classification Search .................. None
See application file for complete search history.

(56) References Cited

U.S. PATENT DOCUMENTS 6,914,643 B1 * 7/2005 Nagase et al. ............... 349/40
7,075,109 B2 * 7/2006 Takahara .................... 257/59

FOREIGN PATENT DOCUMENTS

| JP | 07-230098 A | 8/1995 |
|----|-------------|--------|
| JP | 08-146460 A | 6/1996 |
| JP | 08-179360 A | 7/1996 |
| JP | 2001-318393 A | 11/2001 |
| JP | 2005-93459 A | 4/2005 |
| KR | 2002-0012752 A | 2/2002 |

* cited by examiner

*Primary Examiner*—Leonardo Andújar
*Assistant Examiner*—Fei Fei Yeung Lopez
(74) *Attorney, Agent, or Firm*—Frishauf, Holtz, Goodman & Chick, P.C.

(57) ABSTRACT

A transistor array panel includes switching elements provided in intersecting portions between gate and data lines, and display electrodes connected to the switching elements. A conductive film pattern is provided to be electrically insulated from the gate and data lines, and display electrodes, and to be overlapped on the display electrodes, thereby forming a storage capacitance between each of the display electrodes and the conductive film pattern. A protection circuit is electrically connected to the gate and data lines, and disposed in an outer peripheral portion of a display region in which the switching elements and the display electrodes are formed on the one side of the substrate. A common line is insulated from the protection circuit, connected to the conductive film pattern, and provided to be insulated from the protection circuit and to be at least partially overlapped on the protection circuit, in the outer peripheral portion of the display region.

5 Claims, 7 Drawing Sheets

TRANSISTOR ARRAY PANEL, LIQUID CRYSTAL DISPLAY PANEL, AND METHOD OF MANUFACTURING LIQUID CRYSTAL DISPLAY PANEL

CROSS-REFERENCE TO RELATED APPLICATIONS

This application is based upon and claims the benefit of priority from prior Japanese Patent Application No. 2005-215717, filed Jul. 26, 2005, the entire contents of which are incorporated herein by reference.

BACKGROUND OF THE INVENTION

1. Field of the Invention

The present invention relates to a transistor array panel, a liquid crystal display panel, and a method of manufacturing a liquid crystal display panel.

2. Description of the Related Art

An active matrix driving type liquid crystal display panel has a structure in which a transistor array panel is disposed to face a counter substrate, and a liquid crystal is sandwiched between the transistor array panel and the counter substrate. The liquid crystal display panel is formed by patterning thin-film transistors, pixel electrodes and the like in a matrix form on a substrate such as a transparent glass substrate. The counter substrate is constracted by forming a counter electrode and the like all over itself.

The conventional transistor array panel includes a plurality of gate lines arranged in a row direction, and a plurality of data lines arranged in a column direction. The thin-film transistors and the pixel electrodes are formed in intersecting portions between the gate lines and the data lines. A region where the plurality of thin-film transistors and pixel electrodes are arranged in the matrix form is referred to as a display region.

The gate lines are connected to lead-in wiring lines on a left or right side of the display region, and electrically connected to a driving circuit via the lead-in wiring lines. The data lines are connected to lead-in wiring lines on an upper or lower side of the display region, and connected to the driving circuit via the lead-in wiring lines.

In an outer peripheral portion of the display region where the pixel electrodes are arranged, to protect the gate lines and the data lines from static electricity, protective lines electrically connected to the gate lines and the data lines via a protective element, and annular common lines of a protection circuit connected to the protective lines via resistance elements are disposed to cross the gate lines and the data lines at right angles.

The common line and the protective line of the protection circuit, and the gate lines crossing the data lines at right angles are formed by patterning an all over formed conductive film (gate metal film) simultaneously with the gate electrodes of the thin-film transistors and the gate lines. The common line and the protective line of the protection circuit, and the data lines crossing the gate lines at right angles are formed by patterning another all over formed conductive film (drain metal film) on a gate insulating film coated with the gate metal film simultaneously with source and drain electrodes of the thin-film transistors and the data lines. There are insulated, by the gate insulating film, a portion between the gate line and the data line and a portion between the gate and data line and the common and protective line of the protection circuit crossing the gate and data lines at right angles.

The common line of the protection circuit made of the gate metal film or the drain metal film conducts electricity owing to a contact hole extending through the gate insulating film in the intersecting portion, and the common line is annularly formed. Each of the protective element and the resistance element is made of the gate metal film or the drain metal film simultaneously with formation of the thin-film transistor (e.g., Jpn. Pat. Appln. KOKAI Publication No. 2005-93459).

In the outer peripheral portion of the display region of the liquid crystal display panel, the protective line and the common line of the protection circuit, the protective element and the resistance element need to be disposed. As described above, any of them is made of the gate metal film or the drain metal film. Therefore, to insulate them from each other, portions formed of the same conductive film have to be formed apart from each other. In general, in the display region of the transistor array panel, a conductive film pattern for forming a storage capacitance is formed, and this conductive film pattern is electrically connected to common lines of the storage capacitance in the outer peripheral portion of the display region. When the common lines of this storage capacitance are made of the gate metal film or the drain metal film, to insulate these lines from each other, the lines have to be formed apart from each other in one plane. Therefore, the outer peripheral portion of the display region further broadens.

BRIEF SUMMARY OF THE INVENTION

An object of the present invention is to provide a transistor array panel, a liquid crystal display panel, and a method of manufacturing the liquid crystal display panel in which it is possible to reduce a space necessary for forming the protective line and the common line of the protection circuit, the protective element and the resistance element, and the common line of the storage capacitance in the outer peripheral portion of the display region, and a frame of the liquid crystal display panel can be narrowed.

According to a first aspect of the present invention, there is provided a transistor array panel comprising:

a substrate;

a plurality of first conductive lines and a plurality of second conductive lines arranged on one side of the substrate to cross one another at right angles;

an insulating film interposed between the plurality of first conductive lines and the plurality of second conductive lines;

a plurality of first switching elements provided in intersecting portions between the plurality of first conductive lines and the plurality of second conductive lines on the one side of the substrate, respectively;

a plurality of display electrodes connected to the first switching elements, respectively;

at least one conductive film pattern provided to be electrically insulated from the plurality of first conductive lines, the plurality of second conductive lines and the plurality of display electrodes, and to be overlapped on the display electrodes, thereby forming a storage capacitance between each of the display electrodes and the conductive film pattern;

a protection circuit electrically connected to each of the first conductive lines and the second conductive lines, and disposed in an outer peripheral portion of a display region in which the plurality of first switching elements and the plurality of display electrodes are formed on the one side of the substrate; and a first common line insulated from the protection circuit, connected to the at least one conductive film pattern, and provided to be insulated from the protection circuit and to be at least partially overlapped on the protection circuit, in the outer peripheral portion of the display region.

Moreover, according to a second aspect of this invention, there is provided a liquid crystal display panel comprising:

(a) a transistor array panel including:

one substrate;

a plurality of gate lines and a plurality of data lines arranged on one side of the one substrate to cross one another;

an insulating film interposed between the plurality of gate lines and the plurality of data lines;

a plurality of first thin-film transistors provided in intersecting portions between the plurality of gate lines and the plurality of data lines on the one side of the one substrate, respectively;

a plurality of pixel electrodes connected to the first thin-film transistors, respectively;

a gate electrode of each first thin-film transistor being connected to one of the plurality of gate lines;

one of a drain electrode and a source electrode of each first thin-film transistor being connected to one of the plurality of pixel electrodes;

the other of the drain electrode and the source electrode which is not connected to the pixel electrode being connected to one of the plurality of data lines;

at least one conductive film pattern formed to be electrically insulated from the plurality of gate lines, the plurality of data lines and the plurality of pixel electrodes, and to be overlapped on the pixel electrodes, thereby forming a storage capacitance between each of the pixel electrodes and the conductive film pattern;

a protection circuit electrically connected to the gate lines and the data lines, and disposed in an outer peripheral portion of a display region in which the plurality of first switching elements and the plurality of pixel electrodes are formed on the one side of the one substrate; and a first common line insulated from the protection circuit, electrically connected to the at least one conductive film pattern, and provided to be insulated from the protection circuit and to be at least partially overlapped on the protection circuit, in the outer peripheral portion of the display region;

(b) a counter substrate assembly including:

another substrate; and an electrode formed on one side of the other substrate; and (c) a liquid crystal hermetically introduced between the transistor array panel and the counter substrate assembly arranged to face each other.

Furthermore, according to a third aspect of this invention, there is provided a method of manufacturing a liquid crystal display panel, comprising:

preparing one substrate;

forming a plurality of first conductive lines and a plurality of second conductive lines on one side of the one substrate to cross one another at right angles, with an insulating film being sandwiched therebetween;

forming a plurality of first switching elements in intersecting portions between the plurality of first conductive lines and the plurality of second conductive lines on the one side of the one substrate, respectively, and forming a plurality of display electrodes connected to the first switching elements, respectively;

forming at least one conductive film pattern insulated from the plurality of first conductive lines, the plurality of second conductive lines and the plurality of display electrodes, and overlapped on the display electrodes to form a storage capacitance between each of the display electrodes and the conductive film pattern;

forming a protection circuit connected to the first conductive lines and the second conductive lines in an outer peripheral portion of a display region in which the plurality of first switching elements and the plurality of display electrodes are formed on the one side of the one substrate;

forming a first common line insulated from the protection circuit and connected to the at least one conductive film pattern to be insulated from the protection circuit and to be at least partially overlapped on the protection circuit, in the outer peripheral portion of the display region;

preparing another substrate;

forming an electrode on one side of the other substrate;

arranging the one substrate and the other substrate to face each other; and hermetically introducing a liquid crystal between the one substrate and the other substrate.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
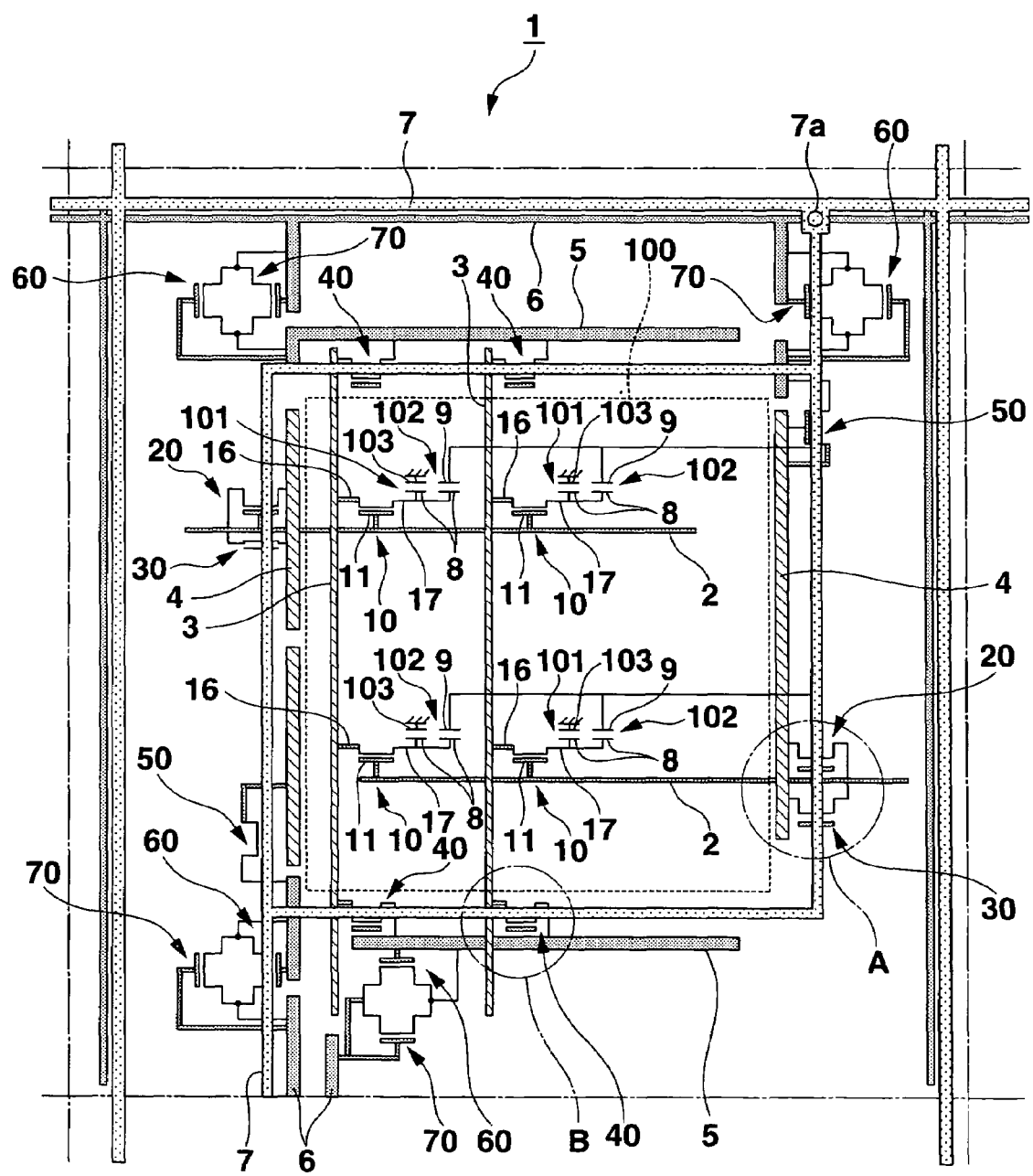
FIG. 1 is a plan view schematically showing an equivalent circuit and a connection structure of a transistor array panel in one embodiment of the present invention.

FIG. 1 is a plan view schematically showing a connection structure of constituting elements, including an equivalent circuit diagram in which a part of the constituting elements of a transistor array panel 1 are denoted with circuit symbols in one embodiment of the present invention. In a display region 100 of the transistor array panel 1 surrounded with a broken line, a plurality of pixel electrodes (display electrodes) 8 are arranged in a matrix form. Along rows of the pixel electrodes 8 formed in the matrix form, gate lines (first conductive lines) 2 are disposed, along columns of the pixel electrodes, data lines (second conductive lines) 3 are arranged, and thin-film transistors (first switching elements, first thin-film transistors) 10 are disposed in intersecting portions between the gate lines 2 and the data lines 3. Gate electrodes 11 of the thin-film transistors 10 are electrically connected to the gate lines 2, drain electrodes 16 of the transistors are electrically connected to the data lines 3, and source electrodes 17 are electrically connected to the pixel electrodes 8.

Each gate line 2 supplies a scanning signal to the gate electrode 11 of the thin-film transistor. Each data line 3 supplies a data signal to the drain electrode 16 of the transistor 10. Instead, the drain electrodes 16 may be connected to the pixel electrodes 8, and the source electrodes 17 may be connected to the data lines, respectively.

FIG. 1 shows only two rows and two columns of the pixel electrodes 8 in the display region 100 for clarification of the drawing. In actual, several hundreds of rows and columns of the pixel electrodes or more pixel electrodes are arranged.

One surface or upper surface of the transistor array panel 1 provided with the pixel electrodes 8 is disposed to face one surface or inner surface of a counter substrate (shown in FIG. 8J) provided with common electrodes 103. The transistor array panel 1 is bonded to the counter substrate via a rectangular-frame-like sealing material to form a sealed structure. A liquid crystal is hermetically introduced into this sealed structure to thereby form a liquid crystal display panel.

An outer peripheral portion of the display region 100 of the transistor array panel 1 is provided with a protection circuit and common lines (first common lines) 7 of a storage capacitance. The protection circuit includes protective lines 4, 5, thin-film transistors 20, 30, 40, 50, 60 and 70 and a protection circuit common line (second common line) 6. The common line 6 of the protection circuit is electrically connected to the protective lines 4, 5 via a plurality of thin-film transistors (resistance elements) 50, 60 and 70 as the resistance elements having nonlinear resistance characteristics or high resistance characteristics. A part of the common line 7 of the storage capacitance is annularly formed in the outer peripheral portion of the display region 100. Portions of the annular part of the common line are positioned on the thin-film transistors (protective elements, second thin-film transistors) 20, 30 and 40 as the protective elements. The common line 7 of the storage capacitance is electrically connected to the common line 6 of the protection circuit via a conductor filled in a contact hole 7a (formed in an insulating film (not shown) interposed between the common line 7 of the storage capacitance and the common line 6 of the protection circuit). The common line 6 of the protection circuit and the common line 7 of the storage capacitance are electrically connected to the common electrode 103 of the counter substrate by a conductive member (not shown).

Figure 2:
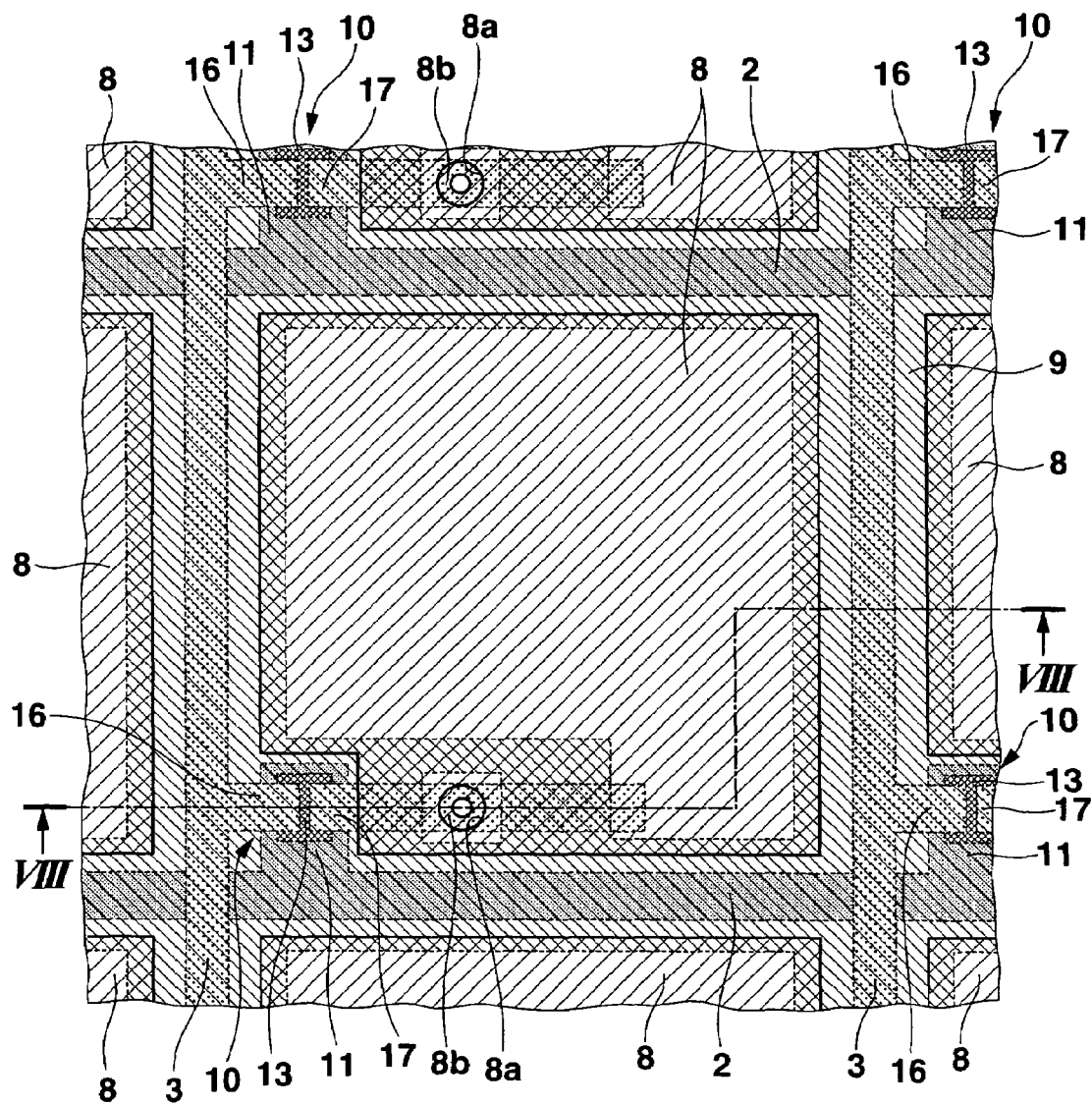
FIG. 2 is a perspective plan view showing a part of a display region of the transistor array panel.

FIG. 2 is a perspective plan view showing a part of the display region 100. As shown in FIG. 2, as described above, the display region 100 is provided with the plurality of gate lines 2 extended in a row direction, and the plurality of data lines 3 extended in a column direction, and the thin-film transistor 10 is disposed in the vicinity of each intersection portion between the gate line 2 and the data line 3. In a region defined by the adjacent gate lines 2 and the adjacent data lines 3, the pixel electrode 8 is disposed.

The gate line 2 is formed integrally with the gate electrode 11 of the thin-film transistor 10. The data line 3 is formed integrally with the drain electrode 16 of the thin-film transistor 10.

Figure 8A:
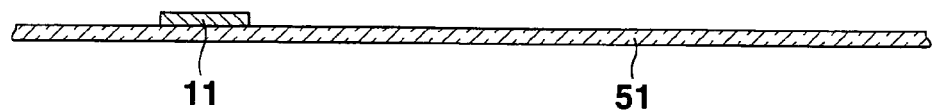
FIG. 8A is a sectional view for illustrating one step of a method of manufacturing a transistor array panel.
Figure 8B:
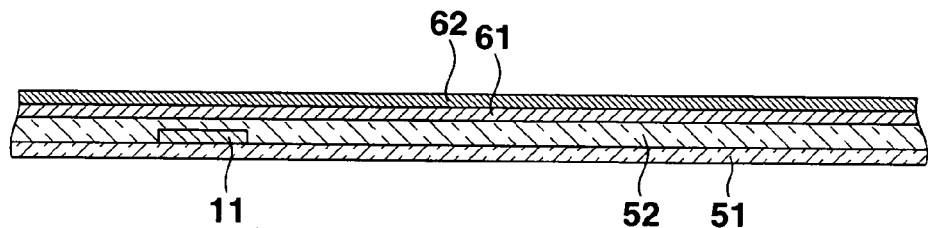
FIG. 8B is a sectional view for illustrating a subsequent step of the step of manufacturing the transistor array panel shown in FIG. 8A.
Figure 8C:
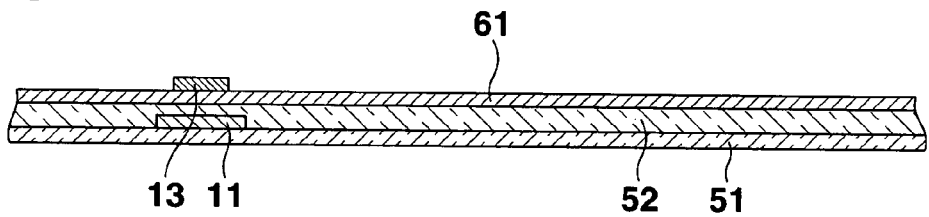
FIG. 8C is a sectional view for illustrating a subsequent step of the step of manufacturing the transistor array panel shown in FIG. 8B.
Figure 8D:
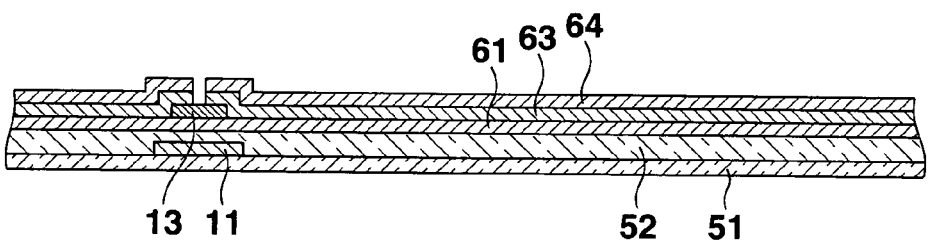
FIG. 8D is a sectional view for illustrating a subsequent step of the step of manufacturing the transistor array panel shown in FIG. 8C.
Figure 8E:
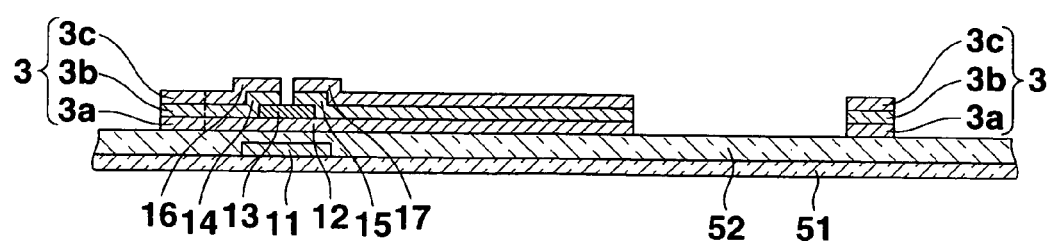
FIG. 8E is a sectional view for illustrating a subsequent step of the step of manufacturing the transistor array panel shown in FIG. 8D.
Figure 8F:
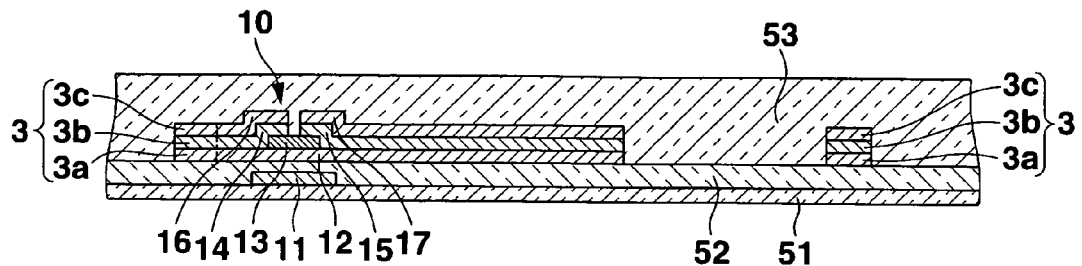
FIG. 8F is a sectional view for illustrating a subsequent step of the step of manufacturing the transistor array panel shown in FIG. 8E.
Figure 8G:
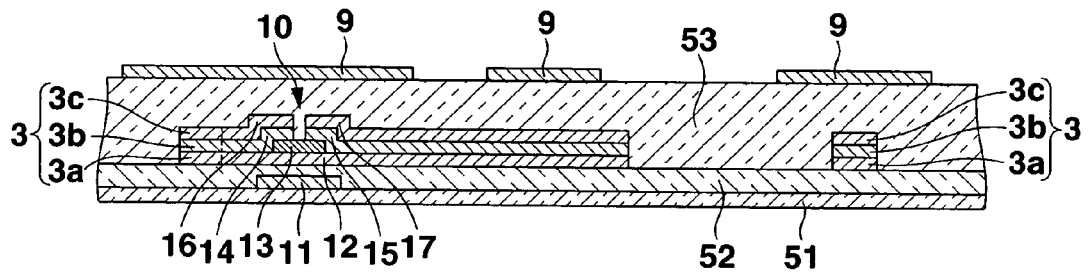
FIG. 8G is a sectional view for illustrating a subsequent step of the step of manufacturing the transistor array panel shown in FIG. 8F.
Figure 8H:
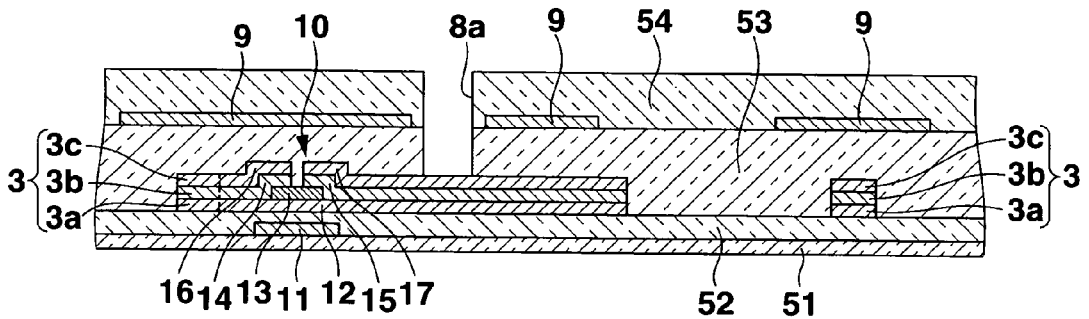
FIG. 8H is a sectional view for illustrating a subsequent step of the step of manufacturing the transistor array panel shown in FIG. 8G.
Figure 8I:
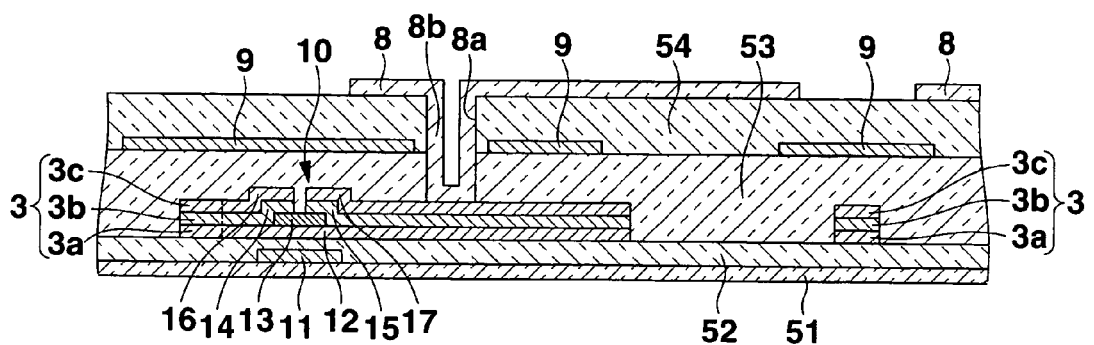
FIG. 8I is a sectional view for illustrating a subsequent step of the step of manufacturing the transistor array panel shown in FIG. 8H.
Figure 8J:
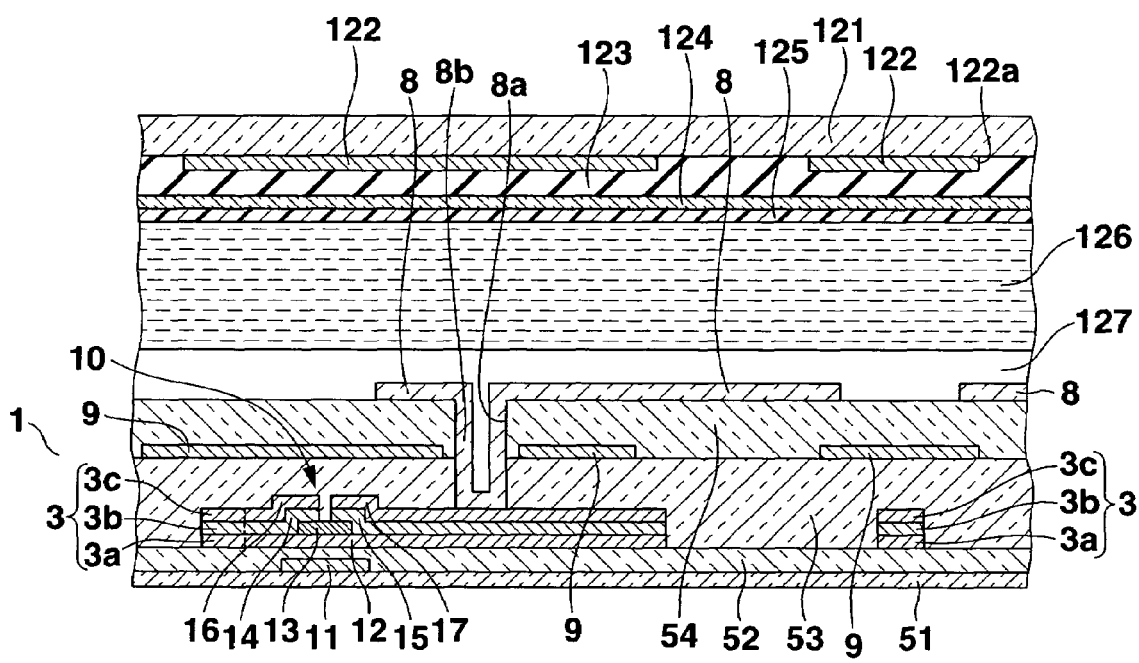
FIG. 8J is a sectional view for illustrating a subsequent step of the step of manufacturing the transistor array panel shown in FIG. 8I.

FIGS. 8I and 8J are sectional views cut along the VIII-VIII line of FIG. 2. As shown in these figures, the thin-film transistor 10 includes the gate electrode 11, a semiconductor thin film 12, a channel protective film 13, ohmic contact layers 14, 15, the drain electrode 16 and the source electrode 17.

The gate electrodes 11 and the gate lines 2 are formed by patterning a conductive or metal layer on an insulating transparent substrate 51 made of glass or the like, and coated with a gate insulating film (insulating film) 52 made of silicon nitride or the like.

The semiconductor thin film 12 is formed on the gate insulating film 52 in a position corresponding to the gate electrode 11, and formed of an intrinsic amorphous silicon layer. The channel protective film 13 is formed on the semiconductor thin film 12 in a position corresponding to the gate electrode 11, and formed of an insulating film made of silicon nitride or the like. The ohmic contact layers 14, 15 are formed on the semiconductor thin film 12 to extend onto the channel protective film 13, and each layer is formed of an n-type or p-type amorphous silicon layer. The drain electrode 16 and the source electrode 17 are mounted on the ohmic contact layers 14, 15, respectively, and each electrode is formed of a metal layer.

The data line 3 is formed by laminating, on the gate insulating film 52, three layers of an intrinsic amorphous silicon layer (first semiconductor layer) 3a, an amorphous silicon layer 3b and a metal layer 3c in order. The intrinsic amorphous silicon layer 3a of the data line 3 is formed integrally with the semiconductor thin film 12 of the thin-film transistor 10, the amorphous silicon layer 3b is formed integrally with the ohmic contact layer 14, and the metal layer 3c is formed integrally with the drain electrode 16.

The thin-film transistors 10 and the data lines 3 are coated with an interlayer insulating film 53.

On the interlayer insulating film 53, to cover the gate lines 2, the data lines 3 and the thin-film transistors 10, a capacitor layer 9 is formed in a mesh or lattice form. The capacitor layer 9 is coated with an overcoat insulating film 54.

On the overcoat insulating film 54, the pixel electrode 8 are disposed to close meshes or openings of the capacitor layer 9. As shown in FIGS. 2 and 8I, in a portion in which the pixel electrode 8 faces the source electrodes 17 of the thin-film transistor 10, a contact hole 8a is disposed to extend through the interlayer insulating film 53 and the overcoat insulating film 54. The contact hole 8a is substantially filled with a conductor 8b integrally with the pixel electrode 8. The conductor 8b is formed of a material similar to that of the pixel electrode 8. Thus, the pixel electrode 8 is electrically connected to the source electrode 17 of the thin-film transistor 10 via the conductor 8b.

The pixel electrode 8 and the conductor 8b are formed of a transparent conductive film having permeability and conductivity. An example of such a transparent conductive film includes a transparent conductive film using an oxide semiconductor such as indium tin oxide (ITO; indium oxide doped with tin), indium zinc oxide (IZO; indium oxide doped with zinc) or cadmium tin oxide (CTO; cadmium oxide doped with tin).

As shown in FIG. 2, the outer peripheral portion of the pixel electrode 8 is superimposed or overlapped on a side edge portion of the capacitor layer 9 with the overcoat insulating film 54 being sandwiched between the portions. The superimposed portion functions as a storage capacitance 102. In a portion where the source electrode 17 of the thin-film transistor 10 faces the pixel electrode 8, any capacitor layer 9 is not formed in a portion where the contact hole 8*a* is to be disposed. Therefore, the conductor 8*b* in the contact hole 8*a* is electrically insulated from the capacitor layer 9.

Next, the outer peripheral portion of the display region 100 will be described. First, the outer peripheral portion on the right side of the display region 100 will be described. It is to be noted that since a left outer peripheral portion of the display region 100 is similar to the right outer peripheral portion, description thereof is omitted.

Figure 3:
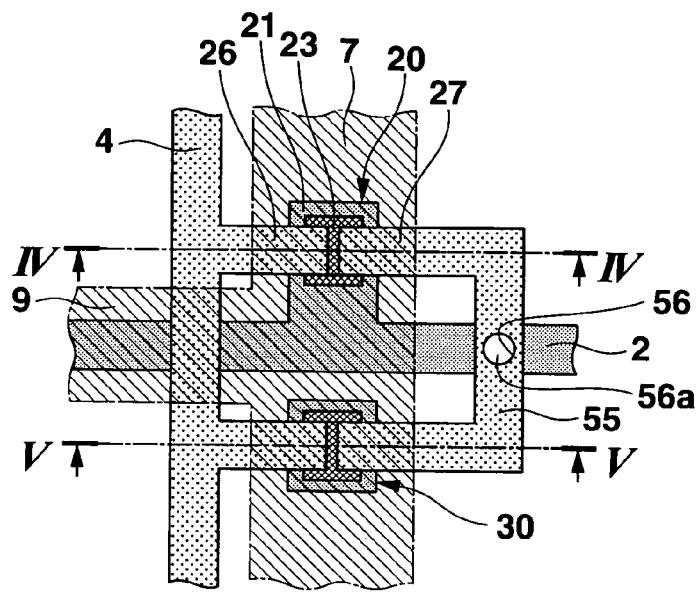
FIG. 3 is a perspective plan view showing a part shown by III in FIG. 1.

FIG. 3 is a perspective plan view showing the right outer peripheral portion (the III part of FIG. 1) of the display region 100. In FIG. 3, the left side indicates the inside of the display region 100, the right side indicates the outside of the display region, and the protective line 4 and the common line 7 of the storage capacitance are disposed along an outer periphery of the display region 100 in a vertical direction of FIG. 3.

In FIG. 3, the gate line 2 extends from the inside (left side of FIG. 3) of the display region 100 to the outside (right side of FIG. 3) of the display region 100. The gate line 2 is electrically connected to a driving circuit via a lead-in wiring line (not shown) outwardly (right side of FIG. 3) from the protective line 4 and the common line 7 of the storage capacitance.

Figure 4:
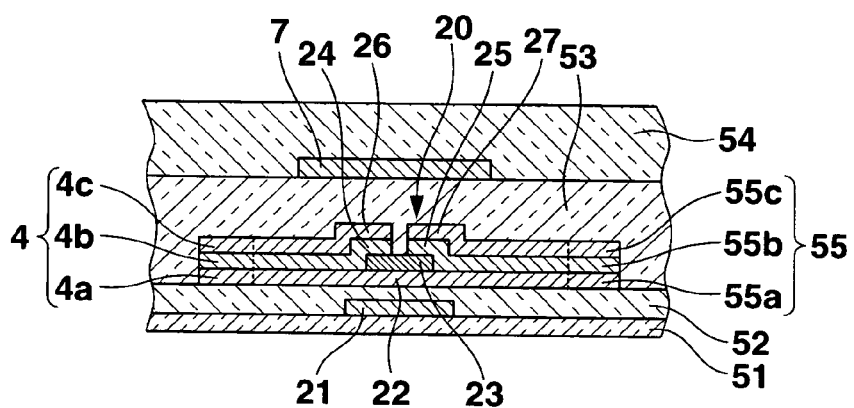
FIG. 4 is a sectional view cut along the IV-IV line of FIG. 3.
Figure 5:
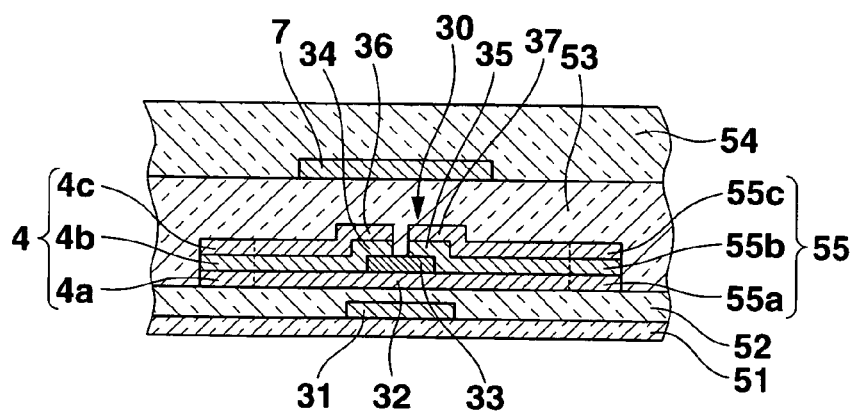
FIG. 5 is a sectional view cut along the V-V line of FIG. 3.

FIG. 4 is a sectional view cut along the IV-IV line of FIG. 3, and FIG. 5 is a sectional view cut along the V-V line of FIG. 3. The protective line 4 which intersects with the gate line 2 is formed by laminating, on the gate insulating film 52, three layers of an intrinsic amorphous silicon layer 4*a*, an amorphous silicon layer 4*b* and a metal layer 4*c* in order in the same manner as in the data line 3. The protective line 4 is insulated from the gate line 2 by the gate insulating film 52.

As shown in FIG. 1, the protective line 4 is electrically connected to the common line 6 of the protection circuit via three thin-film transistors 50, 60 and 70. The common line 6 of the protection circuit is patterned integrally with the gate line 2 on the transparent substrate 51, and coated with the gate insulating film 52 made of silicon nitride or the like.

Moreover, in the intersecting portion between the gate line 2 and the protective line 4, as a protective element which releases static electricity generated in the gate line 2 to the protective line 4, two thin-film transistors 20, 30 are disposed.

As shown in FIGS. 4, 5, the thin-film transistors 20, 30 includes: gate electrodes 21, 31; semiconductor thin films 22, 32; channel protective films 23, 33; ohmic contact layers 24, 25, 34 and 35; drain electrodes 26, 36; and source electrodes 27, 37, respectively.

The gate electrodes 21, 31 of the thin-film transistors 20, 30 are formed and patterned integrally with the gate line 2 on the transparent substrate 51, and coated with the gate insulating film 52 made of silicon nitride or the like. It is to be noted that the gate electrode 21 of the thin-film transistor 20 is formed integrally with the gate line 2, but the gate electrode 31 of the thin-film transistor 30 is a floating gate isolated from the gate line 2 (see FIG. 3).

The semiconductor thin films 22, 32 are formed in positions corresponding to the gate electrodes 21, 31 on the gate insulating film 52, and are formed integrally with the intrinsic amorphous silicon layer 4*a* of the protective line 4. The channel protective films 23, 33 are formed in positions corresponding to the gate electrodes 21, 31 on the semiconductor thin films 22, 32, respectively, and each film is formed of an insulating film made of silicon nitride or the like. The ohmic contact layers 24, 25, 34 and 35 are formed above the semiconductor thin films 22, 32 and the channel protective films 23, 33, and each layer is formed of an amorphous silicon layer. The ohmic contact layers 24, 34 are formed integrally with the amorphous silicon layer 4*b* of the protective line 4. The drain electrodes 26, 36 and the source electrodes 27, 37 are formed on the ohmic contact layers 24, 25, 34 and 35, respectively, and each electrode is formed of a metal layer. The drain electrodes 26, 36 are formed integrally with the metal layer 4*c* of the protective line 4.

The semiconductor thin films 22, 32, the ohmic contact layers 25, 35 and the source electrodes 27, 37 of the thin-film transistors 20, 30 are electrically connected to a connection wiring line 55 disposed in parallel with the protective line 4. The connection wiring line 55 is formed by laminating, on the gate insulating film 52, three layers of an intrinsic amorphous silicon layer (second semiconductor layer) 55*a*, an amorphous silicon layer 55*b* and a metal layer 55*c* in order, the intrinsic amorphous silicon layer 55*a* is formed integrally with the semiconductor thin films 22, 32 of the thin-film transistors 20, 30, the amorphous silicon layer 55*b* is formed integrally with the ohmic contact layers 25, 35, and the metal layer 55*c* is formed integrally with the source electrodes 27, 37.

In an intersecting portion of the gate insulating film 52 between the connection wiring line 55 and the gate line 2, a contact hole 56 is formed to extend through the film 52, The contact hole 56 is substantially filled with a conductor 56*a* which is the same as that of the metal layer 55*c* (FIG. 3). In this manner, the gate line 2 is electrically connected to the connection wiring line 55 via the conductor 56*a*.

The thin-film transistors 20, 30, the connection wiring line 55 and the protective line 4 are coated with the interlayer insulating film 53.

The common line 7 of the storage capacitance is formed in positions corresponding to the thin-film transistors 20, 30 in a vertical direction on the interlayer insulating film 53. The common line 7 of the storage capacitance is formed integrally with the capacitor layer 9, and coated with the overcoat insulating film 54.

Next, a lower outer peripheral portion of the display region 100 will be described. Since an upper outer peripheral portion of the display region 100 is similar to the lower outer peripheral portion, description thereof is omitted.

Figure 6:
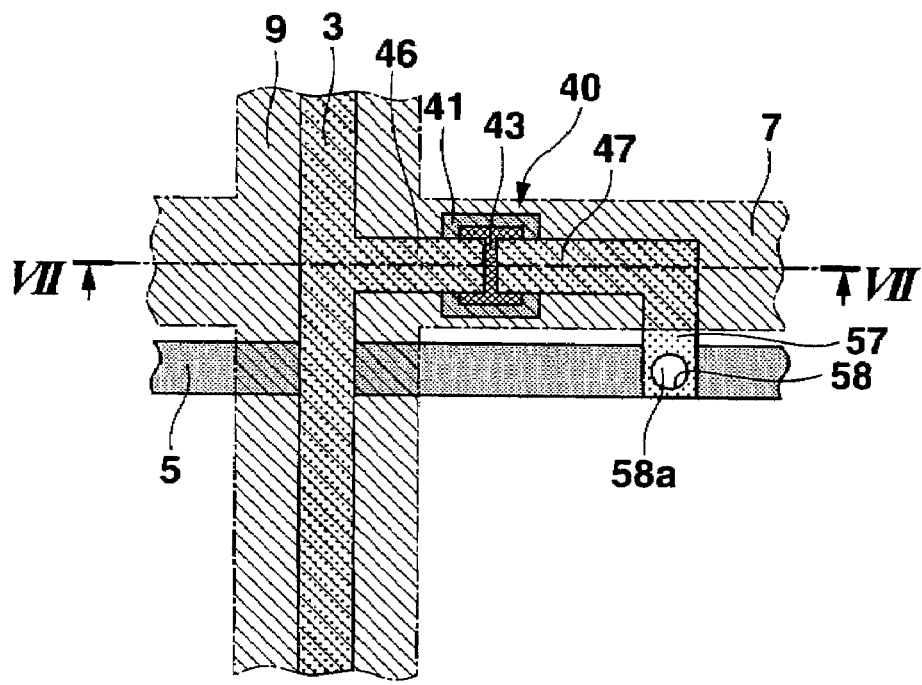
FIG. 6 is a perspective plan view showing a part shown by B in FIG. 1.

FIG. 6 is a perspective plan view showing the lower outer peripheral portion (the part shown by VI in FIG. 1) of the display region 100. In FIG. 6, the upper side indicates the inside of the display region 100, the lower side indicates the outside of the display region, and the protective line 5 and the common line 7 of the storage capacitance are disposed along the outer periphery of the display region 100 in a horizontal direction of FIG. 6.

In FIG. 6, the data line 3 extends from the inside (upper side of FIG. 6) of the display region 100 to the outside (lower side of FIG. 6) of the display region 100. It is to be noted that the data line 3 is connected to a driving circuit via a lead-in wiring line outwardly (lower side of FIG. 6) from the protective line 5 and the common line 7 of the storage capacitance.

The protective line 5 which intersects with the data lines 3 is formed so that a conductive layer is patterned simultaneously with the gate line 2 on the transparent substrate 51, and coated with the gate insulating film 52 made of silicon nitride or the like. Since the data lines 3 are formed on the gate insulating film 52, the lines 3 are insulated from the protective line 5.

As shown in FIG. 1, the protective line 5 is electrically connected to the common line 6 of the protection circuit via two thin-film transistors 60, 70.

Moreover, in an intersecting portion between the data line 3 and the protective line 5, the thin-film transistor 40 is provided, as a protective element which releases static electricity generated in the data line 3 to the protective line 5.

Figure 7:
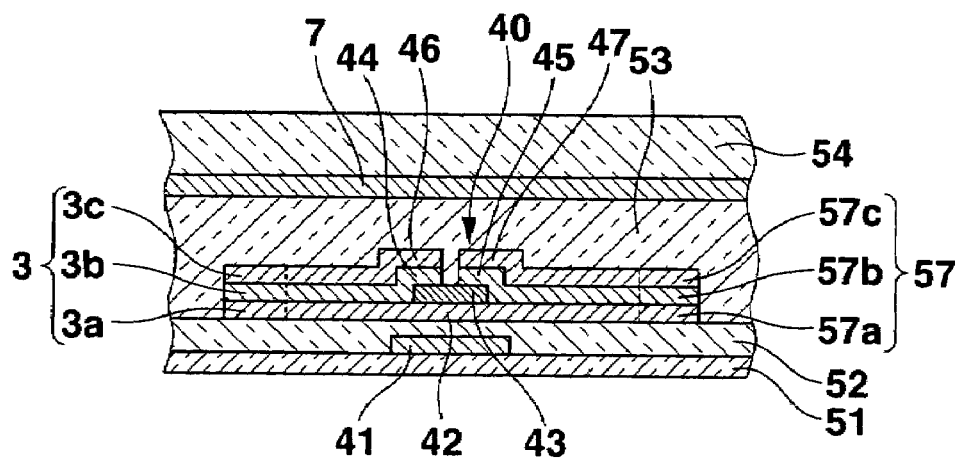
FIG. 7 is a sectional view cut along the VII-VII line of FIG. 6.

FIG. 7 is a sectional view cut along the VII-VII line of FIG. 6. As shown in FIG. 7, the thin-film transistor 40 includes a gate electrode 41, a semiconductor thin film 42, a channel protective film 43, two ohmic contact layers 44, 45, a drain electrode 46, and a source electrode 47.

The gate electrode 41 of the thin-film transistor 40 is formed so that a conductive layer is patterned simultaneously with the gate lines 2 and the protective line 5 on the transparent substrate 51, and coated with the gate insulating film 52 made of silicon nitride or the like. It is to be noted that the gate electrode 41 of the thin-film transistor 40 is a floating gate isolated from the gate line 2 and the protective line 5 (see FIG. 6).

The semiconductor thin film 42 is formed in a position corresponding to the gate electrode 41 on the gate insulating film 52, and formed integrally with the intrinsic amorphous silicon layer 3a of the data line 3. The channel protective film 43 is formed in a position corresponding to the gate electrode 41 on the semiconductor thin film 42, and formed of an insulating film made of silicon nitride or the like. The ohmic contact layers 44, 55 are formed above the semiconductor thin film 42 and the channel protective film 43, and each layer is formed of an amorphous silicon layer. One ohmic contact layer 44 is formed integrally with the amorphous silicon layer 3b of the data line 3. The drain electrode 46 and the source electrode 47 are formed on the ohmic contact layers 44, 45, respectively, and each electrode is formed of a metal layer. It is to be noted that the drain electrode 46 is formed integrally with the metal layer 3c of the data line 3.

The semiconductor thin film 42, the ohmic contact layers 45 and the source electrode 47 of the thin-film transistor 40 are directly connected to a connection wiring line 57 disposed in parallel with the data line 3. The connection wiring line 57 is formed by laminating, on the gate insulating film 52, three layers of an intrinsic amorphous silicon layer 57a, an amorphous silicon layer 57b and a metal layer 57c in order. The intrinsic amorphous silicon layer 57a is formed integrally with the semiconductor thin film 42 of the thin-film transistor 40. The amorphous silicon layer 57b is formed integrally with the ohmic contact layer 45. The metal layer 57c is also formed integrally with the source electrode 47.

In an intersecting portion of the gate insulating film 52 between the connection wiring line 57 and the protective line 5, a contact hole 58 is formed to extend through the gate insulating film 52. The contact hole 58 is substantially filled with a conductor 58a which is the same as that of the metal layer 57c. In this manner, the protective line 5 is electrically connected to the connection wiring line 57 via the conductor 58a.

The thin-film transistor 40, the connection wiring line 57 and the data line 3 are coated with the interlayer insulating film 53.

The common line 7 of the storage capacitance is formed in a position corresponding to the thin-film transistor 40 on the interlayer insulating film 53 to extend in a horizontal direction. The common line 7 of the storage capacitance is formed integrally with the capacitor layer 9, and coated with the overcoat insulating film 54.

Next, one example of a method of forming the transistor array panel 1 will be described with reference to FIGS. 8A to 8J.

First, a gate film is formed all over the top of the transparent substrate 51 by a vapor-phase development process (sputtering process, CVD process, PVD process or the like), and the gate film is patterned by a photolithography process and an etching process. Accordingly, simultaneously with the gate electrode 11, there are formed a plurality of gate lines 2 (not shown), gate electrodes of a plurality of thin-film transistors 10, 20, 30, 40, 50, 60 and 70, the protective line 5 and the common line 6 of the protection circuit (FIG. 8A).

Next, by the vapor-phase development process, the gate insulating film 52 is formed all over the transparent substrate 51, and the gate insulating film 52 covers the plurality of gate lines 2, gate electrodes of the plurality of thin-film transistors 10, 20, 30, 40, 50, 60 and 70, the protective line 5 and the common line 6 of the protection circuit. Next, an intrinsic amorphous silicon layer 61 and a protective insulating film 62 are formed all over the gate insulating film 52 (FIG. 8B).

Next, the protective insulating film 62 is subjected to the photolithography process and the etching process in order, thereby forming the channel protective films 13 of the plurality of thin-film transistors 10, 20, 30, 40, 50, 60 and 70 (FIG. 8C).

Next, by the vapor-phase development process, an amorphous silicon layer 63 is formed all over the gate insulating film 52 and the channel protective films 13 (FIG. 8D). Next, in positions corresponding to the intersecting portion between the connection wiring line 55 and the gate line 2 and the intersecting portion between the connection wiring line 57 and the protective line 5, the contact holes 56, 58 are formed to extend through the gate insulating film 52, the intrinsic amorphous silicon layer 61 and the amorphous silicon layer 63. Next, by the vapor-phase development process, a metal layer 64 is formed all over the amorphous silicon layer 13 (FIG. 8D). Accordingly, the contact holes 56, 58 are filled with the conductors 56a, 58a, respectively.

Next, the intrinsic amorphous silicon layer 61, the amorphous silicon layer 63 and the metal layer 64 are subjected to the photolithography process and the etching process in order. Accordingly, there are formed the semiconductor thin films, the ohmic contact layers, the drain electrodes, and the source electrode of the plurality of thin-film transistors 10, 20, 30, 40, 50, 60 and 70, as well as the data lines 3, the protective line 4 and the connection wiring lines 55, 57 (FIG. 8E).

Next, by the vapor-phase development process, the interlayer insulating film 53 is formed all over them, to cover a plurality of data lines 3, the plurality of thin-film transistors 10, 20, 30, 40, 50, 60 and 70, the connection wiring lines 55, 57 and the protective line 4 (FIG. 8F).

Next, the contact hole 7a is formed to extend through the gate insulating film 52 and the interlayer insulating film 53. Next, the vapor-phase development process, the photolithography process and the etching process are performed in order to fill the contact hole 7a with the conductor. Moreover, the capacitor layer 9 and the common line 7 of the storage capacitance are formed (FIG. 8G).

Next, by the vapor-phase development process, the overcoat insulating film 54 is formed all over them to cover the capacitor layers 9 and the common line 7 of the storage capacitance.

Next, in portions of the interlayer insulating film 53 and the overcoat insulating film 54 superimposed on the source electrodes of the respective thin-film transistors, the contact hole 8a are formed to expose a part of each source electrode 17 (FIG. 8H).

Next, by the vapor-phase development process, the transparent conductive film is formed all over the overcoat insulating film 54. Then, each of the contact holes 8a is filled with the conductor 8b. Thereafter, by the photolithography process and the etching process, the pixel electrodes 8 are formed on the overcoat insulating film 54. In consequence, the transistor array panel 1 is finished (FIG. 8I).

On the other hand, as shown in FIG. 8J, in the surface of a counter substrate 121 to be faced with the transistor array panel 1, a black matrix 122 is formed in which an opening 122a is formed in a portion to be corresponding to the pixel electrode, and a color filter 123 is formed to range from the surface of the black matrix 122 facing the transistor array panel 1 to a portion of the facing surface of the counter substrate 121 exposed by the opening 122a of the black matrix 122. Furthermore, a counter electrode 124 (corresponding to the common electrode 103 shown in FIG. 1) is formed to cover the whole surface of the color filter 123 facing the transistor array panel 1, and an alignment film 125 is formed to cover the whole surface of the counter electrode 124 facing the transistor array panel 1. In consequence, there is formed a counter substrate assembly having the counter substrate 121, the counter electrode 124 and the like. Finally, an alignment film 127 is formed on the manufactured transistor array panel 1, the transistor array panel 1 is allowed to face the counter substrate 121, a liquid crystal 126 is sandwiched between the transistor array panel 1 and the counter substrate 121, and the liquid crystal is sandwiched between the substrates 1 and 121 by a frame-like seal (not shown), whereby the liquid crystal display panel is completed.

In the above transistor array panel 1, the common line 7 of the storage capacitance is formed in a layer which is separate from the layers of the thin-film transistors 10, 20, 30, 40, 50, 60 and 70, the gate line 2, the data line 3 and the protective lines 4, 5. Therefore, the protective element (thin-film transistors 20, 30 and 40) can be superimposed on the common line 7 of the storage capacitance. Therefore, as compared with the conventional transistor array panel formed by arranging the protective element and the resistance element, the protective line and the common line of the protection circuit, and the common line of the storage capacitance, a width of the outer peripheral portion of the display region 100 can be narrowed.

In the above embodiment, the protective element is superimposed on the common line 7 of the storage capacitance, but the present invention is not limited to this embodiment, and the protective lines 4, 5 may be superimposed on the common line 7 of the storage capacitance. The common line 7 of the storage capacitance may be broadened, and superimposed on the protective element and both of the protective lines 4, 5.

Moreover, as the protective element, there is used the thin-film transistor, or the thin-film transistor of the floating gate type in which the gate electrode is isolated, but the present invention is not limited to this, and a space charge limited current (SCLC) element may be used in which any gate electrode is not disposed.

In the display region 100, the capacitor layer 9 may be insulated from the gate line 2, the data line 3 and the pixel electrode 8. In the outer peripheral portion of the display region 100, the protective lines 4, 5 may be insulated from the gate line 2 and the data line 3. The common line 7 of the storage capacitance may be insulated from the protective element including the thin-film transistors 20, 30 and 40 and the protective lines 4, 5. Even in a case where a laminating order of them is changed, the frame of the liquid crystal display panel can be narrowed in the same manner as in the above embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A liquid crystal display panel comprising:
 (a) a transistor array panel including:
 one substrate;
 a plurality of gate lines and a plurality of data lines arranged on one side of said one substrate to cross one another;
 an insulating film interposed between the plurality of gate lines and the plurality of data lines;
 a plurality of first thin-film transistors provided in intersecting portions between the plurality of gate lines and the plurality of data lines on the one side of said one substrate, respectively;
 a plurality of pixel electrodes connected to the first thin-film transistors, respectively;
 a gate electrode of each first thin-film transistor being connected to one of the plurality of gate lines;
 one of a drain electrode and a source electrode of each first thin-film transistor being connected to one of the plurality of pixel electrodes;
 the other of the drain electrode and the source electrode which is not connected to the pixel electrode being connected to one of the plurality of data lines;
 at least one conductive film pattern formed to be electrically insulated from the plurality of gate lines, the plurality of data lines and the plurality of pixel electrodes, and to be overlapped on the pixel electrodes, thereby forming a storage capacitance between each of the pixel electrodes and the conductive film pattern;
 a protection circuit electrically connected to the gate lines and the data lines, and disposed in a plane direction of said one substrate in an outer peripheral portion of a display region in which the plurality of first thin-film transistors and the plurality of pixel electrodes are formed on the one side of said one substrate; and
 a first common line which is: (i) insulated from the protection circuit in the outer peripheral portion of the display region, (ii) electrically connected to the at least one conductive film pattern, (iii) arranged to be at least partially overlapped on the protection circuit, and (iv) disposed nearer to said one substrate than the pixel electrodes are;
 (b) a counter substrate assembly including:
 another substrate; and
 an electrode formed on one side of said another substrate; and
 (c) a liquid crystal hermetically introduced between the transistor array panel and the counter substrate assembly arranged to face each other.

2. The liquid crystal display panel according to claim 1, wherein the protection circuit includes:
 at least one protective line insulated from the plurality of gate lines and the plurality of data lines, and disposed to cross the gate lines or the data lines at right angles; and
 a plurality of protective elements which connect the at least one protective line to the gate lines or the data lines, respectively.

3. The liquid crystal display panel according to claim 2, wherein each of the plurality of first thin-film transistors includes a first semiconductor layer, at least one of the plurality of protective elements is a second thin-film transistor including a second semiconductor layer and a gate electrode, and the plurality of first semiconductor layers and the at least one second semiconductor layer are formed in one step.

4. The liquid crystal display panel according to claim 1, wherein the at least one conductive film pattern and the first common line are formed by patterning one conductive film.

5. The liquid crystal display panel according to claim 1, wherein the protection circuit includes at least one protective element which is overlapped with the first common line.

* * * * *